United States Patent [19]

Baum et al.

[11] Patent Number: 4,536,719
[45] Date of Patent: Aug. 20, 1985

[54] INDUCTIVE PRESSURE SENSOR USING TWO OSCILLATORS

[75] Inventors: Helmut Baum, Stuttgart; Heinz Pfizenmaier, Leonberg; Ewald Schmidt, Ludwigsburg; Franz Strauss, Stuttgart, all of Fed. Rep. of Germany

[73] Assignee: Robert Bosch GmbH, Stuttgart, Fed. Rep. of Germany

[21] Appl. No.: 346,047

[22] PCT Filed: Jun. 12, 1981

[86] PCT No.: PCT/EP81/00073
  § 371 Date: Jan. 28, 1982
  § 102(e) Date: Jan. 28, 1982

[87] PCT Pub. No.: WO82/01067
  PCT Pub. Date: Apr. 1, 1982

[30] Foreign Application Priority Data

Sep. 18, 1980 [DE] Fed. Rep. of Germany ....... 3035186

[51] Int. Cl.$^3$ ............................................. H03B 21/00
[52] U.S. Cl. ....................................... 331/37; 331/65;
    73/716; 324/328; 340/626
[58] Field of Search ....................... 331/37, 40, 56, 65;
    73/700, 716, 717, 723, 729, 730, 736, 861.42;
    324/207, 222, 328; 340/626; 336/223, 232

[56] References Cited

U.S. PATENT DOCUMENTS 3,756,081 9/1973 Young ................................. 331/40

FOREIGN PATENT DOCUMENTS

| 989771 | 9/1951 | France . |
| 1359334 | 3/1964 | France . |
| 2167076 | 8/1973 | France . |
| 880944 | 10/1961 | United Kingdom . |
| 1382706 | 2/1975 | United Kingdom . |
| 2063485 | 6/1981 | United Kingdom . |

OTHER PUBLICATIONS

IEEE Transactions On Microwave Theory and Techniques, MTT-16, #7, 7-1968, 'Hybrid Integrated L-Band Transmitter' pp. 482-483.

Primary Examiner—Eugene R. Laroche
Assistant Examiner—Robert J. Pascal
Attorney, Agent, or Firm—Frishauf, Holtz, Goodman & Woodward

[57] ABSTRACT

An inductive pressure sensor is proposed which has at least one coil embodying a frequency-determining part of an oscillator and disposed at a distance from a diaphragm which is deflectable in accordance with pressure. When pressure is exerted on the diaphragm, the inductance of the coil and thus the oscillator frequency are shifted. The coil is a flat, spiral element and the diaphragm has a surface of highly conductive or ferrite material. It is further provided that two oscillators of identical design and having corresponding coils are used, operating under identical thermal conditions. Either one oscillator operates at a fixed frequency, so that both absolute-pressure measurements and differential-pressure measurements relative to ambient pressure can be made, or else the two oscillators can be detunable in accordance with pressure, so that differential-pressure measurements between two media can be made. The output signal is then obtained by mixing. The oscillators are preferably embodied as thin-film elements.

11 Claims, 4 Drawing Figures

INDUCTIVE PRESSURE SENSOR USING TWO OSCILLATORS

The present invention relates generally to an inductive pressure sensor and, more particularly, to a pressure sensor system for use with an automotive internal combustion engine.

BACKGROUND

In various measurement and regulating tasks, it is necessary to measure the pressure of a gas, either as an absolute value, or as a relative value with respect to a second pressure. Examples of such uses would be measuring the intake tube pressure of an internal combustion engine of a motor vehicles, measuring the filling level, or measuring blood pressure electrically in medical technology, among others. An induction difference pressure sensor is disclosed in Swiss Pat. No. 489,792, in which two coil devices, connected in a bridge circuit, interact in push-pull fashion with a diaphragm which is deflectable in accordance with a differential pressure. The inductance of the respective coils or coil devices varies as a function of the deflection of the diaphragm, causing a shift in the frequency of an oscillator, in which the coils are frequency-determining elements.

However, the known apparatus uses cup-shaped ferrite cores for the coils, which necessarily results in a bulky structure. Further, most prior art sensors make no particular provision for preventing the oscillator frequency from drifting due to temperature fluctuations.

THE INVENTION

Accordingly, it is an object to provide a small, temperature-compensated pressure sensor which is particularly adapted for use in an automotive internal combustion engine (I.C.E.).

Briefly, the pressure sensor of the present invention has the advantage over the prior art that particularly small sensor dimensions can be obtained, because of the flat-film form of the coil, which interacts in push-pull fashion with a diaphragm surface which is alternatively a highly conductive or a ferrite material.

By using two oscillators of identical structure, which are disposed spatially together and are thus exposed to identical temperature conditions, it is possible to mix their output signals in such a way as to compensate for temperature dependent frequency drifting of the oscillators. Thus, if one oscillator is set at a fixed frequency, it is possible to make absolute-pressure measurements and differential-pressure measurements relative to atmospheric pressure. Secondly, differential-pressure measurements between two media can be made if the two oscillators, with their respective coils and diaphragms, are exposed to different pressures.

Finally, in a particularly preferred embodiment of the invention, a particularly good compact structure, and thus a particularly good thermal coupling of the oscillators, is attained by forming the oscillators as thin-film elements, which are located on a carrier, together with the coil, which is formed on a flat spiral of film. A printed circuit board is a particularly inexpensive construction for such a sensor.

DRAWINGS

FIG. 1, a basic illustration in the form of a block circuit diagram of one form of embodiment of a pressure sensor according to the invention;

FIG. 2, the circuit diagram of an oscillator such as can be efficaciously used in the apparatus shown in FIG. 1;

FIGS. 3a and b, the front and rear, respectively, of a thin-film shield for realizing the oscillator shown in FIG. 2.

DESCRIPTION OF THE EXEMPLARY EMBODIMENT

Figure 1:
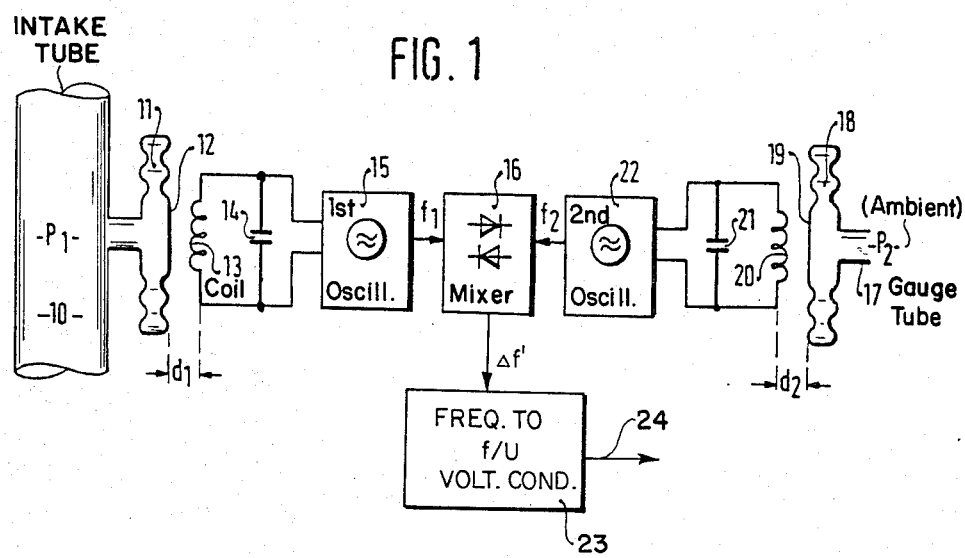

In the exemplary embodiment of a pressure sensor according to the invention as shown in FIG. 1, its use is illustrated for measuring the intake tube pressure of an internal combustion engine of a motor vehicle. It will naturally be understood, however, that the pressure sensor shown can also be used for the other measurement tasks mentioned above solely by way of example and is in no way restricted to the illustrated exemplary embodiment.

In FIG. 1, the intake tube of an internal combustion engine of a motor vehicle is indicated by reference numeral 10. An underpressure $p_1$ prevails in the intake tube. The intake tube 10 communicates via a line with a first pressure chamber 11, which is closed off at one side by a diaphragm 12. A coil 13 is disposed at a distance $d_1$ from the diaphragm 12 and together with a capacitor 14 comprises the frequency-determining element of a first oscillator 15. In accordance with the values of the coil 13 and the capacitor 14, the first oscillator furnishes an output signal having a frequency $f_1$. In a corresponding manner, a second pressure chamber 18 is connected via a gauge tube 17 to the ambient pressure $p_2$. The second pressure chamber 18 also has a diaphragm 19, which is disposed at a distance $d_2$ from a coil 20, which together with a capacitor 21 comprises the frequency-determining element of a second oscillator 22; as described above, the oscillator 22 furnishes an output signal having a frequency $f_2$. The first oscillator 15 and the second oscillator 22 are connected to a mixer 16, at the output of which there is a signal having the frequency $\Delta f = |f_2 - f_1|$. This output signal is delivered to a frequency-to-voltage converter 23, whose output 24 is connected with an evaluator circuit, not shown in the drawing.

The mode of operation of the apparatus shown in FIG. 1 is as follows: The diaphragms 12 and 19 of the first and second pressure chambers 11 and 18, respectively, are provided with a highly conductive or a ferrite surface. The coils 13 and 20 are two-dimensional in embodiment, and the distances $d_1$ and $d_2$ are selected to be very short. If the diaphragms 12 or 19 are now deflected by the pressures $p_1$ or $p_2$, the inductance of the coils 13 or 20 varies; if the diaphragm 12 or 19 and the highly conductive surface approach one another, then the inductance varies such that it is reduced, while in the case of the ferrite surface, the inductance increases. The inductance changes in the coils 13 or 20 caused by the pressure changes in the pressure chambers 11 or 18 are perceived as changes in the frequencies $f_1$ or $f_2$. As a result, the output signal $\Delta f$ of the mixer 16 also varies. This output signal, given sufficiently linear characteristic curves of the pressure chamber and coil assembly, is a likewise linear standard for the pressure difference between the intake tube and the ambient pressure.

The apparatus according to the invention can naturally also be modified such that one of the diaphragms 11, 18 is omitted and the oscillator from which it has been omitted is then operated at a fixed frequency. Then the frequency of the output signal of the mixer 16 is a standard for the differential pressure measured in the remaining pressure chamber relative to ambient pressure, or for the absolute pressure in a remaining absolute-pressure chamber. The intake tube pressure connection is located in this case on the sealed portion of the housing in which the evacuated absolute-pressure chamber is also located.

The use of two oscillators 15, 22 for measuring the absolute pressure as well as the advantage that occurrences of drifting in the frequency of the oscillators 15, 22 can be compensated for. To this end, in accordance with the invention the oscillators 15, 22 are embodied as identical in structure and are disposed spatially so close together that they are exposed to the same ambient temperature. Now if the frequency of the oscillators 15, 22 varies in consequence of changes in the ambient temperature, these frequency changes will be of the same kind and will not be perceived in the output signal of the mixer.

Figure 2:
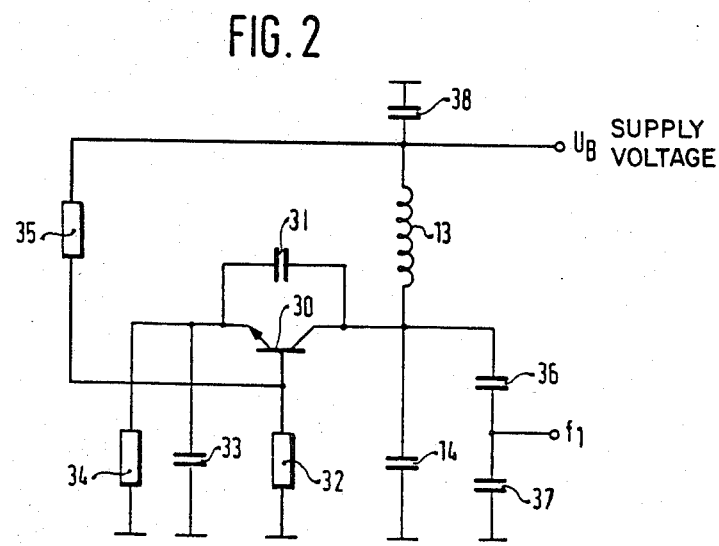

In FIG. 2, the circuit diagram of one form of embodiment of the oscillator is shown, such as may be used for the oscillators 15, 22 of FIG. 1. The frequency-determining elements here are the coil 13 and capacitor 14, connected in series between the supply voltage $U_B$ and ground. The connection path of a transistor 30, which is bridged by a capacitor 31, leads from the junction point of the elements 13, 14 to the parallel circuit of a capacitor 33 and a resistor 34, which are likewise connected to ground at their other ends. The base of the transistor 30 is connected to ground via a resistor 32 and to the supply voltage via a resistor 35. The supply voltage line is further connected to ground via a capacitor 38. The output of the oscillator is provided by two capacitors 36, 37 connected in series and disposed parallel to the capacitor 14; in the illustrated exemplary embodiment, the output signal of frequency $f_1$ can be picked up at the junction point of the capacitors 36, 37.

Figure 3A:
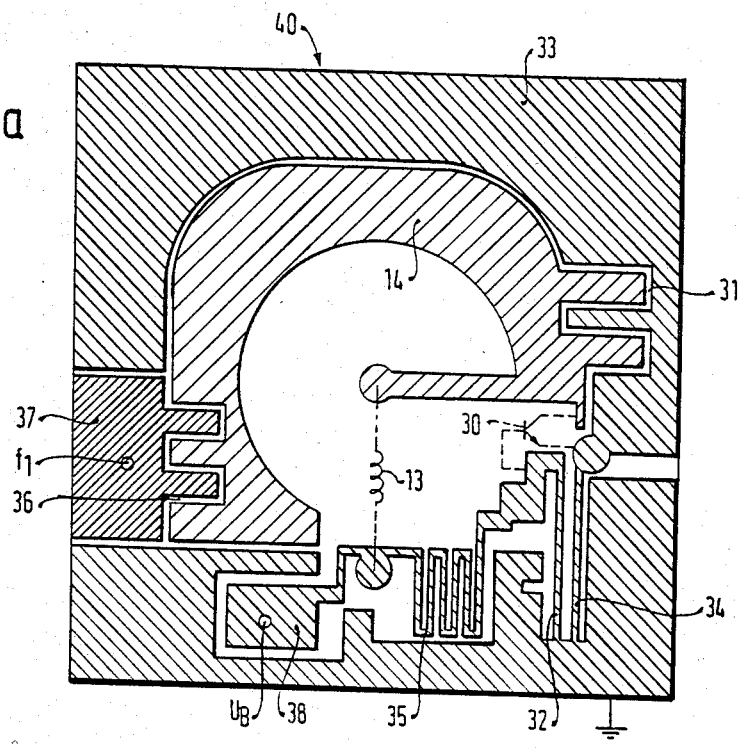
Figure 3B:
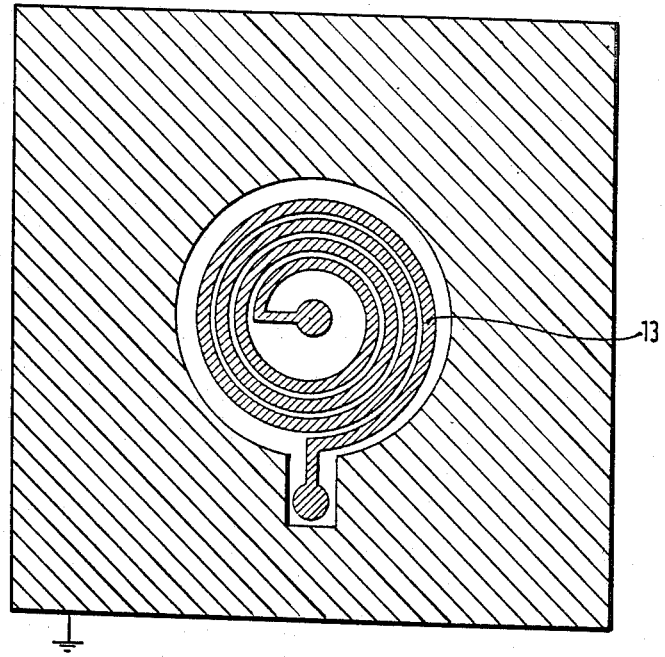

The rear of a thin-film element 40 is shown in FIG. 3a, and the front of the same element is shown in FIG. 3b. With this element, an oscillator whose circuit diagram is given in FIG. 2 can be realized. The coil 13 may be seen on the front, having a two-dimensional embodiment. The other connecting elements of the oscillator are located on the back; for the sake of better comprehension, the coil 13 and the transistor 30, which are not located on the back, are indicated in FIG. 3a by broken lines. As seen in FIG. 3a, the capacitors 31, 36 of the oscillator are embodied as finger-type capacitors; that is, they are embodied as portions of the conductive covering layer of the thin-film element which intermesh like fingers. In contrast, the capacitors 14, 33, 37, 38 are embodied as flat coatings such that the capacitors are embodied by the portions visible in FIG. 3a and the grounded front shown in FIG. 3b. The resistors 32, 34, 35 are embodied in known fashion in a meander pattern or as thin strips.

The coil 13 of two-dimensional embodiment is located opposite the diaphragm 12 a short distance from it; the diaphragm has a surface which is highly conductive or is of ferrite. The pressure-dependent deflection of the diaphragm 12 effects a change in the inductance of the coil 13, as described in detail above. It will naturally be understood that the characteristic pressure/frequency curve can be influenced by the appropriate selection of the geometry of the oscillating-circuit elements on the thin-film element 40, so that not only linear characteristic curves can be attained, but progressive and degressive ones as well. It will further be understood that, instead of a thin-film element, a laminated circuit board or a thick-film element can also be used.

We claim:

1. A compact, temperature-compensated inductive pressure sensor having first (15) and second (22) substantially identical, thermally coupled but otherwise independent oscillator circuits, each including an inductance coil (13,20), and each producing an output signal (f1,f2);

a mixer (23) connected to said oscillator circuits for producing a frequency difference signal which is a predetermined function of the output signals of said oscillator circuits;

wherein, in accordance with the invention, said first oscillator (15) includes a variable inductance electromagnetically responsive to the position of a diaphragm, said diaphragm forming a part of a pressure measurement chamber (11);

said second oscillator (22) includes a variable inductance electromagnetically responsive to the position of a diaphragm, said diaphragm forming a part of a reference pressure chamber (18);

said coils (13,20), forming a part of said oscillator circuits (15,22), are formed as flat films, and at least one (13) of said inductance coils is a variable inductance, said compact pressure sensor including a diaphragm (12) disposed at a variable distance (d1) from said one coil (13), said diaphragm (12) being deflectable in accordance with the pressure (p1) to be sensed and having a layer of material (12) thereon which affects the inductance of the coil (13), and whose deflection thereby affects the frequency of the output signal (f1) of the oscillator circuit (15) of which it forms a part.

2. The compact pressure sensor of claim 1, wherein said inductance-affecting material is a ferrite.

3. The compact pressure sensor of claim 1, wherein said inductance-affecting material is a highly conductive material.

4. The compact pressure sensor of claim 1, wherein the pressure of said reference pressure is ambient air pressure.

5. The compact pressure sensor of claim 1, wherein the pressure of said reference pressure chamber is an absolute pressure in a sealed chamber.

6. The compact pressure sensor of claim 1, wherein first (15) and second (22) oscillator circuits are provided, disposed spatially so close together that they are exposed to the same ambient temperature, said first oscillator (15) includes a variable inductance electromagnetically responsive to the position of a diaphragm, said diaphragm forming a part of a first pressure measurement chamber (11), and said second oscillator (22) includes a variable inductance electromagnetically responsive to the position of a diaphragm, said diaphragm forming a part of a second pressure measurement chamber (18), to permit differential-pressure measurements between two media.

7. The compact pressure sensor of claim 1, wherein first (15) and second (22) oscillator circuits are provided, disposed spatially so close together that they are exposed to the same ambient temperature, said first oscillator (15) includes a variable inductance electromagnetically responsive to the position of a diaphragm, said diaphragm forming a part of a pressure measurement chamber (11), and the inductance of said second oscillator (22) is fixed, so as to limit the frequency drift of said second oscillator to that caused by temperature fluctuations, and to permit compensation of said frequency difference signal for such temperature fluctuations.

8. A pressure sensing system, in combination with the induction pipe of an automotive internal combustion engine (I.C.E.), comprising at least two substantially identical, thermally coupled but otherwise independent oscillator circuits (15,22), each including an inductance coil (13,20), and each producing an output signal ($f_1,f_2$);

a mixer (23) connected to said oscillator circuits for producing a frequency difference signal which is a predetermined function of the output signals of said oscillator circuits;

wherein, in accordance with the invention, said coils (13,20), forming a part of said oscillator circuits (15,22), are formed as flat films, and at least one (13) of said inductance coils is a variable inductance, said compact pressure sensor including a diaphragm (12) disposed at a variable distance ($d_1$) from said one coil (13), said diaphragm (12) being deflectable in accordance with the pressure ($p_1$) to be sensed and having a layer of material (12) thereon which affects the inductance of the coil (13), and whose deflection thereby affects the frequency of the output signal ($f_1$) of the oscillator circuit (15) of which it forms a part.

9. The pressure sensing system of claim 8, wherein said inductance-affecting material is a ferrite.

10. The pressure sensing system of claim 8, wherein said inductance-affecting material is a highly conductive material.

11. A compact, temperature-compensated inductive pressure sensor having a least first and second substantially identical, thermally coupled but otherwise independent oscillator circuits (15,22), each including an inductance coil (13,20), and each producing an output signal ($f_1,f_2$);

a mixer (23) connected to said oscillator circuits for producing a frequency difference signal which is a predetermined function of the output signals of said oscillator circuits;

wherein, in accordance with the invention, said coils (13,20), forming a part of said oscillator circuits (15,22), are formed as flat films, and are variable inductances, each electromagnetically responsive to the position of a respective diaphragm (12,19), each of said diaphragms (12,19) being respectively disposed at a variable distance ($d_1,d_2$) from its respective coil (13,20), a first one (12) of said diaphragm forming a part of a pressure measurement chamber (11), being deflectable in accordance with the pressure ($p_1$) to be sensed and having a layer of material (12) thereon which affects the inductance of its coil (13), and whose deflection thereby affects the frequency of the output signal ($f_1$) of said first oscillator circuit (15) of which it forms a part, and a second one (19) of said diaphragm forming a part of a reference pressure chamber (18), being deflectable in accordance with the reference pressure ($p_2$) therein and having a layer of material (19) on said diaphragm which affects the inductance of its coil (20), and whose deflection thereby affects the frequency of the output signal ($f_2$) of said second oscillator circuit (22) of which it forms a part.

* * * * *